United States Patent
Lee et al.

(10) Patent No.: US 7,795,692 B2
(45) Date of Patent: Sep. 14, 2010

(54) RESONATOR AND FABRICATION METHOD THEREOF

(75) Inventors: Joo-ho Lee, Yongin-si (KR); Hae-seok Park, Yongin-si (KR); Sang-hun Lee, Yongin-si (KR); Duck-hwan Kim, Yongin-si (KR); Sang-chul Sul, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 197 days.

(21) Appl. No.: 11/657,587

(22) Filed: Jan. 25, 2007

(65) Prior Publication Data

US 2008/0042780 A1     Feb. 21, 2008

(30) Foreign Application Priority Data

Aug. 16, 2006  (KR)  ...................... 10-2006-0077224

(51) Int. Cl.
*H01L 29/06*   (2006.01)
*H01L 31/00*   (2006.01)

(52) U.S. Cl. ........................ 257/416; 257/419; 257/420; 257/E27.006

(58) Field of Classification Search ................. 257/416, 257/420

See application file for complete search history.

(56) References Cited

U.S. PATENT DOCUMENTS

| | | | | |
|---|---|---|---|---|
| 4,642,508 A | * | 2/1987 | Suzuki et al. ............... | 310/321 |
| 5,448,068 A | * | 9/1995 | Lee et al. .................. | 250/338.3 |
| 5,612,536 A | * | 3/1997 | Torii et al. ................ | 250/338.3 |
| 5,692,279 A | * | 12/1997 | Mang et al. ................ | 29/25.35 |
| 6,271,619 B1 | * | 8/2001 | Yamada et al. .............. | 310/324 |
| 6,657,363 B1 | * | 12/2003 | Aigner ....................... | 310/324 |
| 2005/0093397 A1 | | 5/2005 | Yamada et al. | |
| 2006/0001508 A1 | | 1/2006 | Ohara et al. | |
| 2006/0139414 A1 | * | 6/2006 | Iwashita et al. ............... | 347/68 |

FOREIGN PATENT DOCUMENTS

| | | |
|---|---|---|
| DE | 10241425 A1 | 3/2004 |
| EP | 1406383 A3 | 4/2004 |
| JP | 9-69749 A | 3/1997 |
| JP | 2004-120494 A | 4/2004 |
| JP | 2005-159402 A | 6/2005 |
| JP | 3-740061 B2 | 11/2005 |
| WO | 99/37023 A1 | 7/1999 |
| WO | 2006/027873 A1 | 3/2006 |

OTHER PUBLICATIONS

Robert Thalhammer et al., "Prediction of BAW resonator performance using experimental and numerical methods", Ultrasonics Symposium, Aug. 23-27, 2004, pp. 282-285, USA.

* cited by examiner

*Primary Examiner*—Jarrett J Stark
(74) *Attorney, Agent, or Firm*—Sughrue Mion, PLLC (57) ABSTRACT

A resonator including a substrate, and a resonating unit having an active region that causes resonances and a non-active region that does not cause resonances, and having a first electrode, a piezoelectric film, and a second electrode layered in turn on the substrate. At least one of the first and the second electrodes is formed, so that at least a portion of a non-active region portion thereof has a thickness different from that of an active region portion thereof.

25 Claims, 6 Drawing Sheets

RESONATOR AND FABRICATION METHOD THEREOF

CROSS-REFERENCE TO RELATED APPLICATIONS

This application claims priority under 35 U.S.C. §119(a) from Korean Patent Application No. 10-2006-0077224 filed on Aug. 16, 2006, in the Korean Intellectual Property Office, the disclosure of which is incorporated herein by reference in its entirety.

BACKGROUND OF THE INVENTION

1. Field of the Invention

Methods and apparatuses consistent with the present invention relate to a resonator, which extracts an oscillation or wave of a predetermined frequency using a resonance phenomenon, and a fabrication method thereof.

2. Description of the Related Art

Recently, with a rapid development of mobile communication apparatuses, chemical and bio apparatuses, etc., a demand for small and lightweight filters, oscillators, resonant elements, acoustic resonant mass sensors, etc., which are used in such apparatuses, is increasing.

As a means for realizing the small and lightweight filter, the oscillator, the resonant element, the acoustic resonant mass sensor, etc, a film bulk acoustic resonator (FBAR) is known. The FBAR is advantageous in that it can be manufactured in large quantities at a minimal cost and embodied in a microsize. In addition, the FBAR can realize a high value of quality factor Q, which is a main characteristic of the filter, and can be used even in a micro frequency band, particularly, a personal communication system (PCS) band and a digital coreless system (DCS) band.

In general, the FBAR is configured in a structure including a resonating unit in which a first electrode, a piezoelectric film, and a second electrode are layered in turn on a substrate.

An operation of the FBAR is as follows. First, when electric energy is applied to the first and the second electrodes, an electric field is incited in the piezoelectric film. The electric field incites a piezoelectric phenomenon to the piezoelectric film, so that the resonating unit oscillates in a predetermined direction. As a result, a bulk acoustic wave is produced in the same direction as the oscillating direction of the resonating unit to cause resonances.

However, the FBAR generates an insertion loss in a real operation. Such an insertion loss is generated because when the FBAR generates the resonances, mechanical energy is changed into thermal energy, or acoustic energy in the form of the bulk acoustic wave converted into a lateral mode form is leaked outside an active region of the resonating unit or into the substrate.

To reduce the insertion loss, a resonator has been proposed in which a frame-like layer with a narrow width is formed along an edge of an active region that causes resonances. The resonator is disclosed in U.S. Pat. No. 6,812,619. The frame-like layer causes an edge part and a center part of an active region portion of an upper electrode to have heights different from each other. Accordingly, in a resonance, a frequency difference exists between an edge part and a center part of an active region of the resonator due to a difference in height between the edge part and the center part of the active region portion of the upper electrode on which the frame layer is formed. As a result, a leakage of a bulk acoustic wave converted into a lateral mode form outside the active region is prevented, and thus the center part of the active region causes uniform resonances. However, the resonator is disadvantageous in that since the frame-like layer is formed to change the height of the edge part of the active region portion of the upper electrode, resonance characteristic of the edge part of the active region portion, particularly, a value of an effective piezoelectric coefficient $Kt^2$ is changed.

Also, the insertion loss of the FBAR is influenced by electric resistance according to electric conductivity of the electrodes forming the FBAR. Accordingly, to reduce the insertion loss caused by the electric conductivity of the electrodes, it is preferable to increase the electrodes in thickness or to form the electrodes with a material having a high electric conductivity. However, there is a limit, in that such a method increases fabrication costs. Therefore, there is required a new method capable of minimizing the insertion loss of the FBAR caused by the electric conductivity of the electrodes without increasing the electrodes in thickness or forming the electrodes with the costly material having the high electric conductivity.

SUMMARY OF THE INVENTION

An aspect of the present invention is to address at least the above problems and/or disadvantages and to provide at least the advantages described below. Accordingly, an aspect of the present invention is to provide a resonator in which an electrode in an active region that causes resonances has a thickness different from that in the non-active region that does not cause resonances, thereby improving resonance characteristic and reducing an insertion loss, and a fabrication method thereof.

Another aspect of the present invention is to provide a resonator in which a metal film is additionally formed on an electrode in an region except for an active region that causes resonances, thereby reducing an insertion loss caused by electric resistance of the electrode without increasing the electrode in thickness or forming the electrode with a costly material having a high electric conductivity, and a fabrication method thereof.

Additional aspects and advantages of the invention will be set forth in part in the description which follows and, in part, will be obvious from the description, or may be learned by practice of the invention.

According to an aspect of the present invention, a resonator includes a substrate, and a resonating unit comprising an active region that causes resonances and a non-active region that does not cause resonances, and having a first electrode, a piezoelectric film, and a second electrode layered in turn on the substrate. At least one of the first and the second electrodes is formed, so that at least a portion of a non-active region portion thereof has a thickness different from that of an active region portion thereof.

Further, at least one of the first and the second electrodes may include a metal film formed on at least the portion of the non-active region portion, so that at least the portion of the non-active region portion has a thickness larger than that of the active region portion.

The metal film may be formed on at least one of an undersurface of the first electrode, an upper surface of the first electrode, an undersurface of the second electrode, and an upper surface of the second electrode. At this time, preferably, but not necessarily, the metal film is formed in a belt shape, which surrounds the active region portion of at least one of the first and the second electrodes. Alternatively, the metal film may have at least one groove or at least one penetrated hole formed along the middle of the width of the belt shape.

Preferably, but not necessarily, the metal film is formed of the same metal as that of the first and the second electrodes or the same metal as that of an electrode pad, which electrically connects the first and the second electrodes of the resonating unit with an external circuit, when the electrode pad is formed.

Also, preferably, but not necessarily, the metal film is formed of Au, Ti, Ta, Mo, Ru, Pt, W, Al, or Ni.

Alternatively, the metal film may be formed on an edge part of the active region portion of at least one of the first and the second electrodes, so that the edge part of the active region portion has a thickness larger than that of a center part of the active region portion thereof.

According to another aspect of the present invention, a fabrication method of a resonator includes forming a first electrode, a piezoelectric film and a second electrode in turn on a substrate to form a resonating unit, and forming a metal film on at least a portion of a non-active region portion of at least one of the first and the second electrodes.

The forming of the resonating unit may include forming a sacrificing layer on the substrate, forming a membrane on the sacrificing layer, forming the first electrode, the piezoelectric film and the second electrode in turn on the membrane, and removing the sacrificing layer.

The forming of the metal film may include forming a metal layer, and patterning the metal layer in a predetermined pattern.

Preferably, but not necessarily, the forming of the metal film is carried out at a point of time after forming the membrane, a point of time after forming the first electrode, a point of time after forming the piezoelectric film, or a point of time after forming the second electrode. If the forming of the metal film is carried out at the point of time after the second electrode, preferably, but not necessarily, the metal film is formed of the same metal as that of the first and the second electrodes or the same metal as that of an electrode pad, which electrically connects the first and the second electrodes of the resonating unit with an external circuit, together with the electrode pad. Also, preferably, but not necessarily, the metal film is formed of Au, Ti, Ta, Mo, Ru, Pt, W, Al, or Ni.

Preferably, but not necessarily, the patterning the metal layer is carried out by patterning the metal film in a belt shape, which surrounds an active region portion of the at least one of the first and the second electrodes. At this time, the belt shape may have at least one groove or at least one penetrated hole formed along the middle of the width thereof.

The removing of the sacrificing layer may be carried out after the patterning the metal film.

Alternatively, the method may further include forming a metal film on an edge part of an active region portion of at least one of the first and the second electrodes.

BRIEF DESCRIPTION OF THE DRAWINGS

The above aspects and features of the present invention will be more apparent from the description for exemplary embodiments of the present invention taken with reference to the accompanying drawings, in which.

Throughout the drawings, the same drawing reference numerals will be understood to refer to the same elements, features, and structures.

DETAILED DESCRIPTION OF EXEMPLARY EMBODIMENTS OF THE INVENTION

The matters defined in the description such as a detailed construction and elements are provided to assist in a comprehensive understanding of the exemplary embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
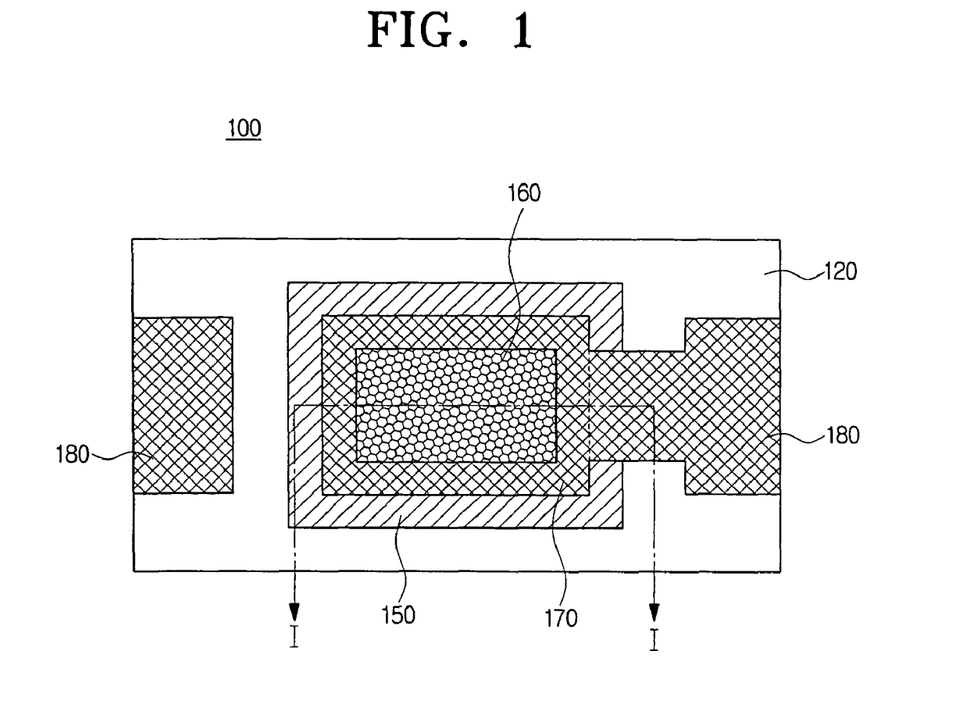
FIG. 1 is a top plan view illustrating a film bulk acoustic resonator in accordance with an exemplary embodiment of the present invention.
Figure 2:
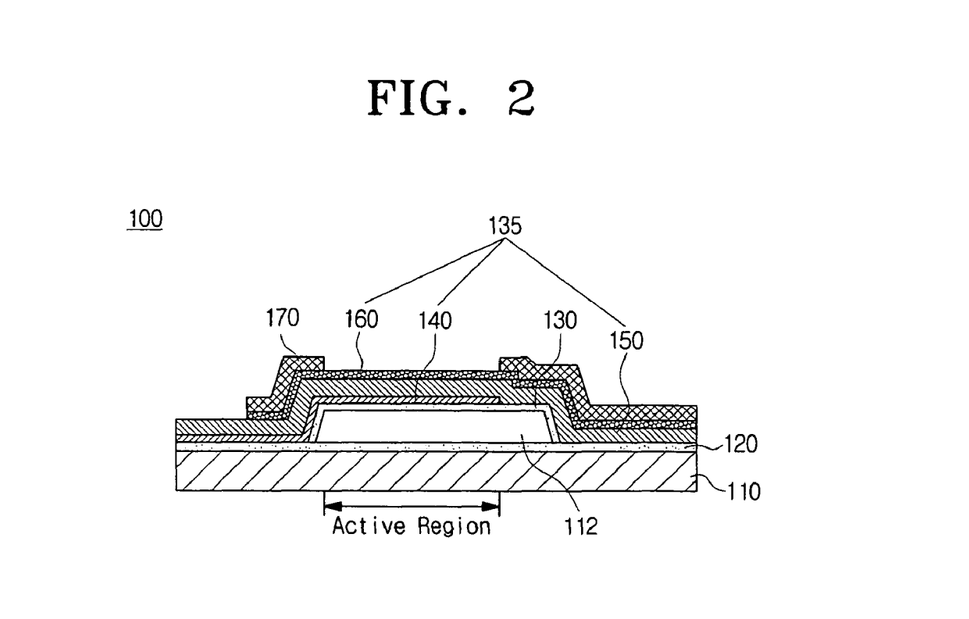
FIG. 2 is a cross-sectional view taken along line I-I of FIG. 1.

FIG. 1 is a top plan view illustrating a film bulk acoustic resonator (FBAR) according to an exemplary embodiment of the present invention, and FIG. 2 is a cross-sectional view taken along line I-I of FIG. 1.

Referring to FIG. 2, the FBAR 100 according to the exemplary embodiment of the present invention includes a substrate 110, an insulating layer 120, an air cavity 112, and a resonating unit 135.

The substrate 110 is made of a general silicon substrate.

On the substrate 110 is layered the insulating layer 120, which electrically isolates the resonating unit 135 from the substrate 110. The insulating layer 120 is formed depositing $SiO_2$ or $Al_2O_3$ on the substrate 110 by using a chemical vapor deposition method, a RF magnetron sputtering method, or an evaporation method.

The air cavity 112 is disposed on the insulating layer 120. The air cavity 112 is located under the resonating unit 135, so that the resonating unit 135 can be oscillated in a predetermined direction. The air cavity 112 is formed by a series of processes, which forms an air cavity sacrificing layer pattern 111 (see FIG. 3B) on the insulating layer 120, forms a membrane 130 on the air cavity sacrificing layer pattern 111 (see FIG. 3C), and then etches and removes the air cavity sacrificing layer pattern 111, as described below.

The resonating unit 135 includes a first electrode 140, a piezoelectric film 150 and a second electrode 160, which are layered and located in turn over the air cavity 112.

The first electrode 140 is disposed on the membrane 130 forming the air cavity 112. The first electrode 140 is formed of a general conductive material, such as a metal. To be more specific, the first electrode 140 may be made up of Au, Ti, Ta, Mo, Ru, Pt, W, Al, or Ni.

The piezoelectric film 150 is disposed to cover the insulating layer 120, the membrane 130, and the first electrode 140. The piezoelectric film 150, as a portion that causes a piezoelectric effect to convert electric energy to mechanical energy in the form of an elastic acoustic wave, is formed of AiN, ZnO, PZT (PbZrTiO), etc.

The second electrode 160 is disposed on the piezoelectric film 150. Like the first electrode 140, the second electrode 160 is formed of a conductive material, such as Au, Ti, Ta, Mo, Ru, Pt, W, Al, or Ni.

Such a resonating unit 135 is divided into an active region and a non-active region. As illustrative in FIG. 2, the active region of the resonating unit 135, as a region that causes resonances oscillating in a predetermined direction by a piezoelectric phenomenon when electric energy, such as radio frequency (RF) signals, is applied to the first and the second electrodes 140 and 160 to incite an electric field in the piezoelectric film 150, is a portion where all of the first electrode 140, the piezoelectric film 150 and the second electrode 160 are overlapped in a vertical direction over the air cavity 112. That is, in the exemplary embodiment of the present invention illustrated in FIG. 2, right and left parts of the active region of the resonating unit 135 are defined by a right end of the first electrode 140 and a left end of the air cavity 112, respectively. The non-active region of the resonating unit 135, as a region that does not cause resonances by the piezoelectric phenomenon even though the electric energy is applied to the first and the second electrodes 140 and 160, is a portion where only the piezoelectric film 150 and the second electrode 160 are overlapped outside the active region.

The resonating unit 135 constructed as described above filters a radio signal of predetermined frequency using the piezoelectric effect of the piezoelectric film 150 described above. That is, the RF signals applied through the second electrode 160 are outputted toward the first electrode 140 via the resonating unit 135. At this time, since the resonating unit 135 has a predetermined resonance frequency according to oscillations generated from the piezoelectric film 150, only a signal corresponding to the predetermined resonance frequency of the resonating unit 135 among the RF signals is outputted.

However, as described in the description of the related art, in an operation of the resonating unit 135, acoustic energy in the form of a bulk acoustic wave converted into a lateral mode form is leaked outside the active region or into the substrate 110, so that the resonating unit 135 generates losses.

To prevent the losses, a metal film 170 is disposed on the second electrode 160, which is located in the non-active region of the resonating unit 135. As illustrated in FIG. 1, the metal film 170 is formed in the form of a looped curve-shaped belt with a predetermined width, which surrounds an active region portion of the second electrode 160. Also, the metal film 170 is made up of a metal with a high electric conductivity, for example, Au, Ti, Ta, Mo, Ru, Pt, W, Al, or Ni.

When an electrode pad 180 (see FIG. 1), which electrically connects the first and the second electrodes 140 and 160 of the resonating unit 135 with an external circuit, is formed, the metal film 170 can be formed of the same metal as that of the electrode pad 180, together therewith. At this time, preferably, but not necessarily, the electrode pad 180 is made up of the same material as that of the metal film 170 described above.

The metal film 170 constructed as described above causes a non-active region portion of the second electrode 160 to have a thickness larger that that of the active region portion of the second electrode 160. Accordingly, when the resonating unit 135 resonates, a frequency difference is generated between the active region and the non-active region of the resonating unit 135. As a result, a leakage of the bulk acoustic wave converted into the lateral mode form outside the active region is prevented, thereby allowing the active region to uniformly cause resonances.

Also, the metal film 170 is disposed, coming in contact with the second electrode 160, so that it provides an effect to increase the thickness of the second electrode 160. In addition, the metal film 170 is formed of the metal with the high electric conductivity, so that it improves the electric conductivity in combination with the second electrode 160 made of the predetermined material, i.e., Au, Ti, Ta, Mo, Ru, Pt, W, Al, or Ni. Accordingly, an insertion loss caused by electric resistance, which is unavoidably generated according to the thickness and the material of the second electrode 160, can be addressed.

Figure 6:
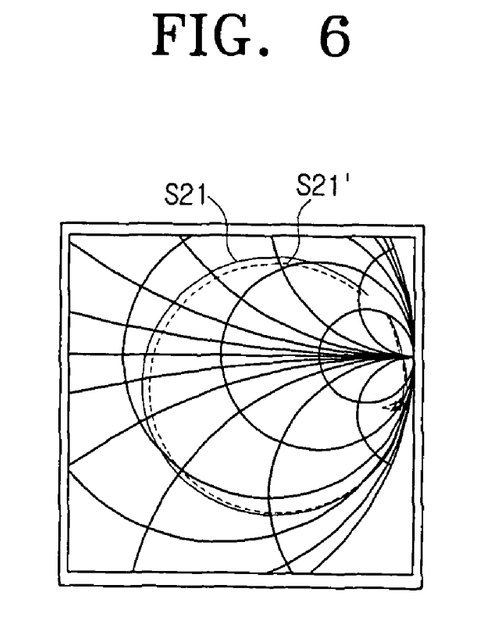
FIG. 6 is a Smith's chart illustrating passing characteristics of a resonator in which a metal film is formed in accordance with an exemplary embodiment of the present invention and a resonator in which a metal film is not formed.

According to an experiment of the present applicant, as illustrated in FIG. 6, it can be appreciated that in a case that the metal film 170 is formed in accordance with the exemplary embodiment of the present invention, a passing characteristic S21 of the resonating unit 135 is less deviated from a circle on a Smith's chart than a passing characteristic S21' in a case that the metal film 170 is not formed.

Figure 4:
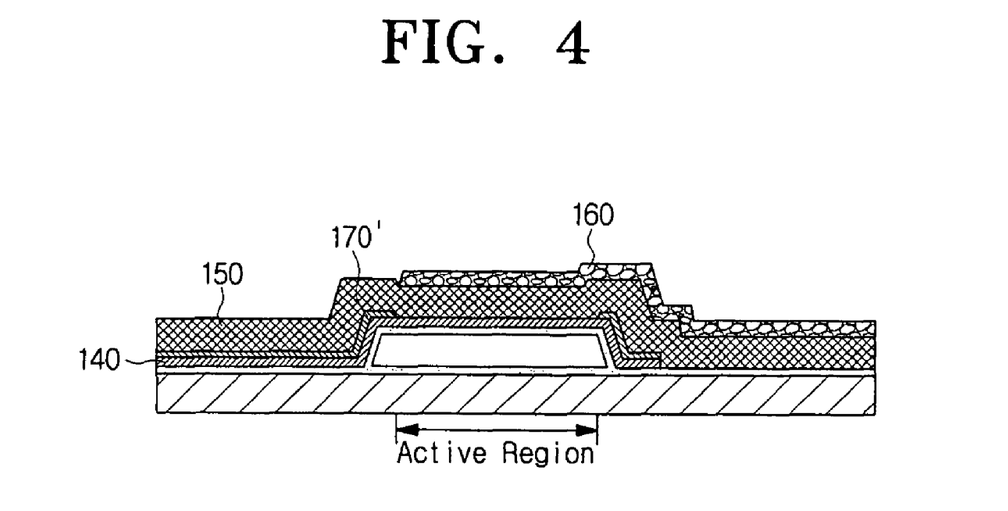
FIG. 4 is a cross-sectional view illustrating another exemplary embodiment of the resonator illustrated in FIG. 2.

As above, although the metal film 170 is illustrated and explained as disposed on the upper surface of the second electrode 160, the present invention is not limited to that. For instance, the metal film can be disposed on a position capable of preventing the bulk acoustic wave from being leaked outside the active area and improving the insertion loss caused by the electric resistance, that is, on an undersurface (not illustrated) of the first electrode 140, an upper surface (170'; see FIG. 4) of the first electrode 140, or an undersurface (not illustrated) of the second electrode 160 in the non-active region of the resonating unit 135.

Figure 5:
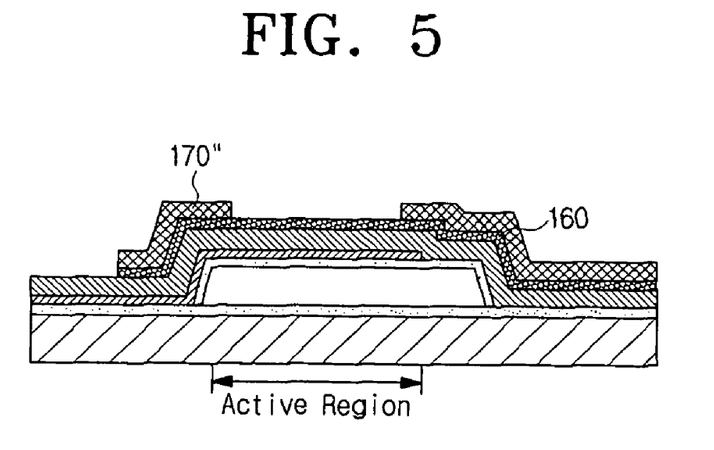
FIG. 5 is a cross-sectional view illustrating another exemplary embodiment of the resonator illustrated in FIG. 2.

Further, although the metal film 170 is illustrated and explained as disposed only on the non-active region portion of the second electrode 160, the present invention is not limited to that. For instance, as illustrated in FIG. 5, a metal film 170" can be disposed on the non-active region portion of the second electrode 160 (or the first electrode), and at the same time, disposed extending to an edge part of an active region portion of the second electrode 160 (or the first electrode) within a limit that does not deteriorate the effects of improving the resonance characteristic and the insertion loss as described above.

Figure 7A:
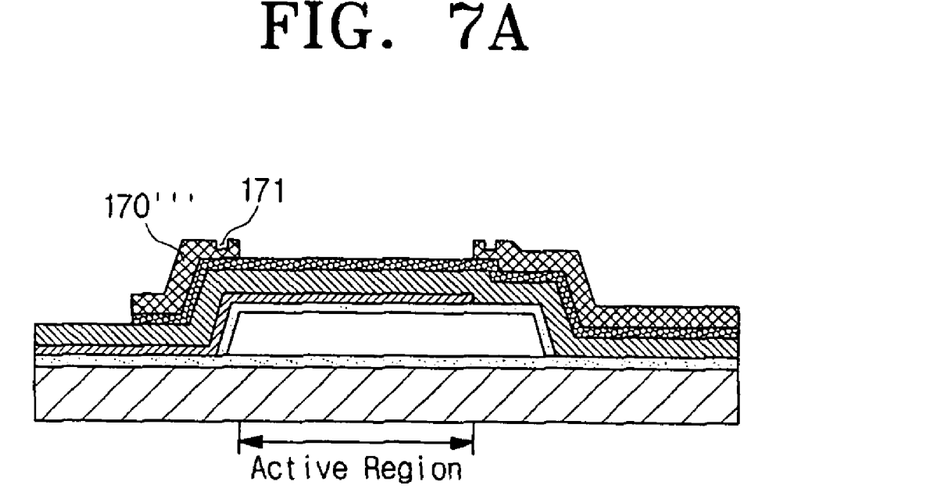
FIGS. 7A and 7B are cross-sectional views illustrating still another exemplary embodiment of the resonator illustrated in FIG. 2.
Figure 7B:
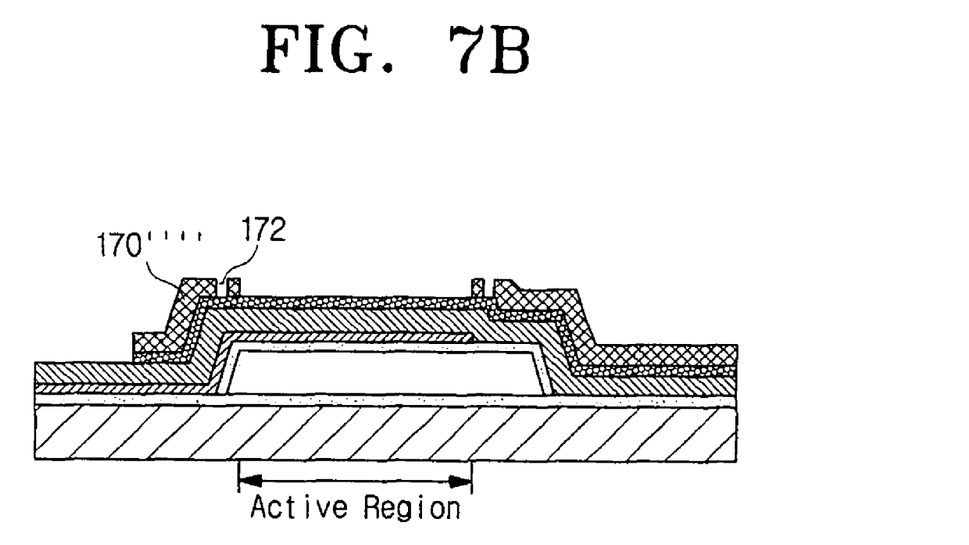

Also, although the metal film 170 is illustrated and explained as formed in the form of the flat looped curve-shaped belt with uniform thickness, it can be provided with a groove 171 or a penetrated hall 172 in the form of a single looped curve, which is formed along the middle in width of the metal film in the form of the looped curve-shaped belt, as illustrated as a reference numeral 170''' or 170'''' in FIGS. 7A and 7B. The groove 171 or the penetrated hall 172 changes frequency characteristic in the portion or region where the metal film is formed during the resonance, so that it further prevents the bulk acoustic wave converted into the lateral mode form from being leaked outside the active region of the resonating unit 135. Accordingly, in this case, the insertion loss of the FBAR can be further reduced, as compared with a FBAR having a metal film in which the groove 171 or the penetrated hall 172 is not formed.

As described above, the FBAR 100 according to the exemplary embodiment of the invention has the additional metal film 170, 170', 170", 170''' or 170'''', which causes the thickness of the first or the second electrode 140 or 160 in the active region of the resonating unit 135 to differ from that of the first or the second electrode 140 or 160 in the non-active region of the resonating unit 135. Accordingly, the resonance characteristic of the resonating unit 135 is improved and the insertion loss of the FBAR 100 is reduced.

Hereinafter, a fabrication method of the FBAR 100 of FIGS. 1 and 2 constructed as described above will be described in details with reference to FIGS. 3A through 3G.

Figure 3A:
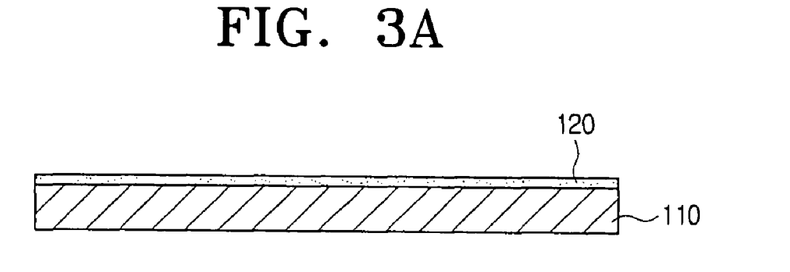
FIGS. 3A through 3G are cross-sectional views illustrating a fabrication process of the resonator illustrated in FIG. 2.

First, as illustrated in FIG. 3A, an insulating layer 120, which is made up of $SiO_2$ or $Al_2O_3$, is deposited on an upper surface of the substrate 110.

Figure 3B:
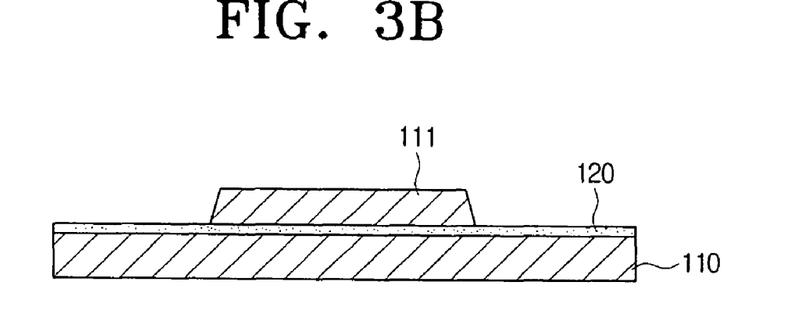

Subsequently, as illustrated in FIG. 3B, to form an air cavity sacrificing layer pattern 111, a sacrificing layer (not illustrated) is formed on the insulating layer 120. The sacrificing layer is made up of a material, such as polysilicon, which helps to form the following electrodes and the following piezoelectric film and which is easily etched, so that the air cavity sacrificing layer pattern 111 can be removed by an etching process later. The sacrificing layer is etched by using a sacrificing layer mask pattern (not illustrated) with a pattern of an air cavity 112, which is formed by a photolithography process, as a mask, and the sacrificing layer mask pattern is removed. As a result, the air cavity sacrificing layer pattern 111 is formed on the insulating layer 120 of the substrate 110. The air cavity sacrificing layer pattern 111 will be removed later to define an inner side shape of the air cavity 112.

Figure 3C:
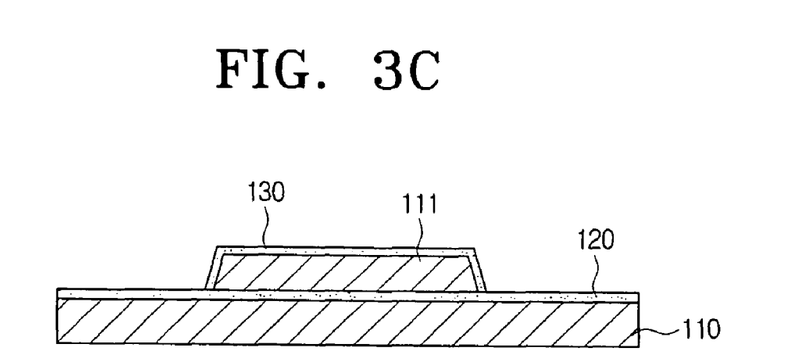

After that, as illustrated in FIG. 3C, a membrane 130 is formed on the substrate 110 over which the air cavity sacrificing layer pattern 111 is formed. The membrane 130 is made up of a silicon nitride or a silicon oxide, which is a flexible dielectric substance.

Figure 3D:
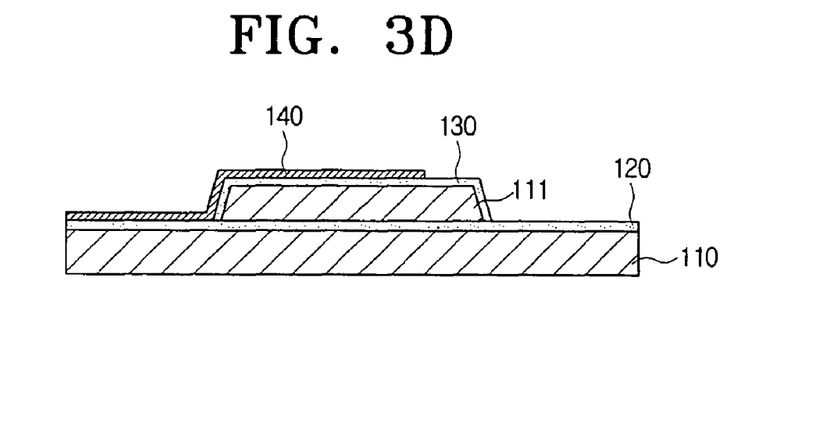
Figure 3E:
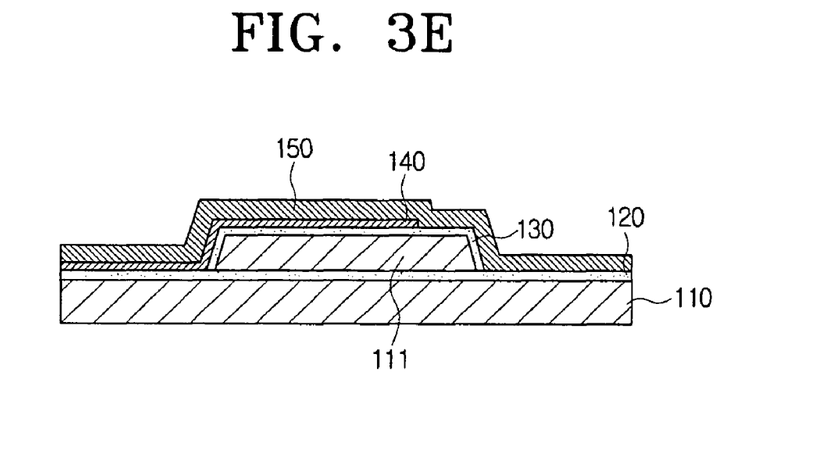
Figure 3F:
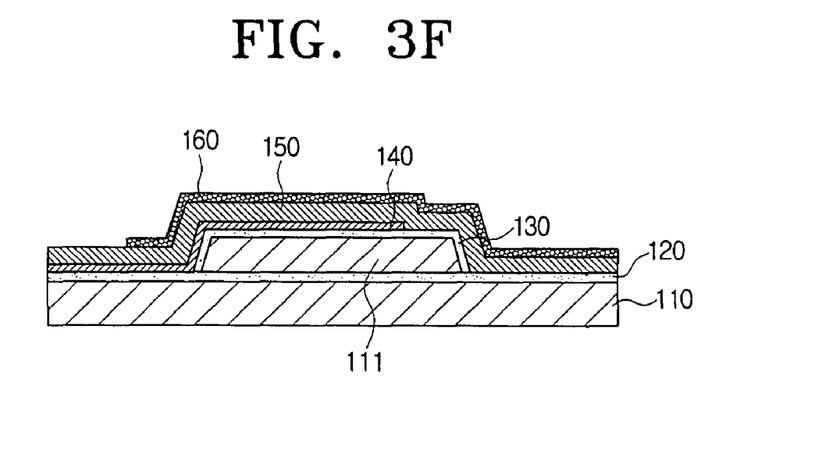

After the membrane 130 is formed, as illustrated in FIGS. 3D through 3F, a first electrode 140, a piezoelectric film 150, and a second electrode 160 are formed in turn on the membrane 130, so that a resonating unit 135 is formed.

To be more specific, first, a first metal layer (not illustrated) is deposited in a predetermined thickness on an entire upper surface of the membrane 130. The first metal layer is made up of a conductive material, such as Au, Ti, Ta, Mo, Ru, Pt, W, Al, or Ni. The first metal layer is patterned by using a laser trimming method, or etched by using a first electrode pattern (not illustrated) with a pattern of the first electrode 140, which is formed by a photolithography process, as a mask. As a result, as illustrated in FIG. 3D, the first electrode 140 is formed, which exposes predetermined portions of the insulating layer 120 and the membrane 130.

And then, a piezoelectric layer (not illustrated) is deposited in a predetermined thickness on an upper surface of the first electrode 140 and the exposed upper surfaces of the insulating layer 120 and the membrane 130. The piezoelectric layer is made up of AiN, ZnO, or PZT. Like the first electrode 140, the piezoelectric layer is patterned by using the etching method or the laser trimming method. As a result, as illustrated in FIGS. 1 and 3E, the piezoelectric film 150 is formed, which exposes a predetermined portion of the insulating layer 120 and a predetermined portion of the first electrode 140 on which an electrode pad 180 will be formed later.

After that, a second metal layer (not illustrated) is deposited on an entire upper surface of the piezoelectric film 150. The second metal layer is made up of a conductive material, such as Au, Ti, Ta, Mo, Ru, Pt, W, Al, or Ni. Like the first electrode 140, the second metal layer is patterned by using the etching method or the laser trimming method. As a result, as illustrated in FIG. 3F, the second electrode 160 is formed, which exposes a predetermined portion of the piezoelectric film 150 and the insulating layer 120 and the predetermined portion of the first electrode 140 on which the electrode pad 180 will be formed later.

Figure 3G:
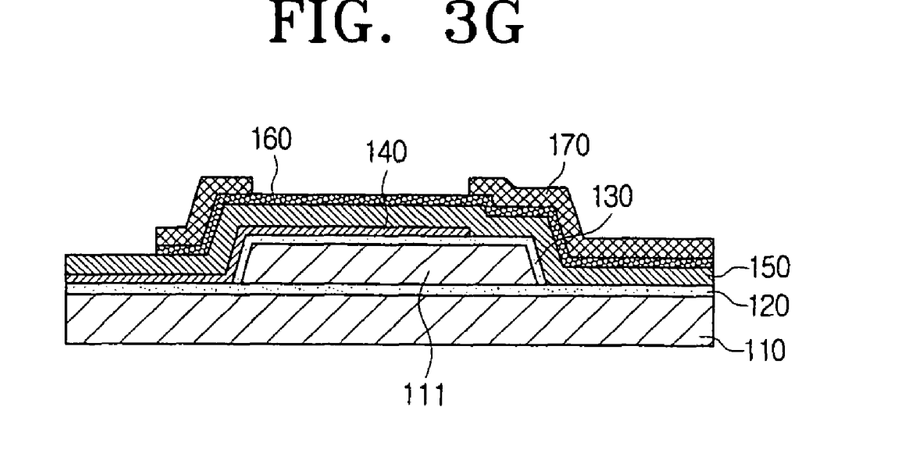

After the resonating unit 135 is formed as described above, to form a metal film 170 and the electrode pad 180, a third metal layer (not illustrated) is formed in a predetermined thickness over an entire upper surface of the substrate 110 over which the second electrode 160 is formed. The third metal layer is made up of a metal with a high electric conductivity, such as Au, Ti, Ta, Mo, Ru, Pt, W, Al, or Ni. The third metal layer is patterned by using a lift-off method or an etching method of using a metal film/electrode pad pattern (not illustrated) with a pattern of the metal film 170 and the electrode pad 180, which is formed by a photolithography process, as a mask. As a result, as illustrated in FIGS. 1 and 3G, the metal film 170 and the electrode pad 180 are formed over the substrate 110.

Next, to form the air cavity 112, the air cavity sacrificing pattern 111 is removed by an etching process of using $XeF_2$ gas, or a wet etching process of using a solvent having an etching selectivity with respect to the sacrificing material of the air cavity sacrificing pattern 111. At this time, the air cavity sacrificing pattern 111 can be removed through an etching passage (not illustrated) formed on the substrate 110. As a result, the air cavity 112 is formed over the substrate 110, and the fabrication process of the FBAR 100 is completed.

As apparent from the foregoing description, according to the exemplary embodiments of the present invention, the resonator and the fabrication method thereof has the additional metal film, which causes the thickness of the first or the second electrode in the active region of the resonating unit to differ from that of the first or the second electrode in the non-active region of the resonating unit. Accordingly, the resonating characteristic of the resonating unit is improved and the insertion loss of the resonator is reduced.

Also, according to the exemplary embodiments of the present invention, the resonator and the fabrication method thereof additionally form the metal film on the electrode portion outside the active region that causes the resonances. Accordingly, the resonator and the fabrication method thereof according to the exemplary embodiments of the present invention can reduce the insertion loss caused by the electric resistance of the electrodes without increasing the electrodes in thickness or forming the electrodes with the costly material with the high electric conductivity.

Although representative embodiments of the present invention have been shown and described in order to exemplify the principle of the present invention, the present invention is not limited to the specific embodiments. It will be understood that various modifications and changes can be made by one skilled in the art without departing from the spirit and scope of the invention as defined by the appended claims. Therefore, it shall be considered that such modifications, changes and equivalents thereof are all included within the scope of the present invention.

What is claimed is:

1. A resonator comprising:
    a substrate; and
    a resonating unit divided into an active region that causes resonances and a non-active region that does not cause resonances, and having a first electrode, a piezoelectric film, and a second electrode layered in turn on the substrate,
    wherein each of the first electrode and the second electrode have an active region portion and a non-active region portion,
    at least one of the first and the second electrodes is formed, so that at least a portion of the non-active region portion of the at least one of the first and the second electrodes has a thickness different from that of the active region portion of the at least one of the first and the second electrodes, respectively,
    the active region is a portion of the resonator in which all of the first electrode, the piezoelectric film, and the second electrode are overlapped in a vertical direction over an air cavity,
    a non-active region is another portion of the resonator where the piezoelectric film and the second electrode are overlapped outside of the active region in the vertical direction of the resonator, and the piezoelectric film is disposed on the first electrode and the air cavity, so that the air cavity at an upper surface thereof is covered by the piezoelectric film and the air cavity at side surfaces thereof is covered by piezoelectric film, the air cavity being surrounded by the piezoelectric film.

2. The resonator as claimed in claim 1, wherein at least one of the first and the second electrodes comprises a metal film formed thereon on at least the portion of the non-active region portion of the at least one of the first and the second electrodes, so that at least the portion of the non-active region portion of the at least one of the first and the second electrodes has a thickness larger than that of the active region portion of a respective electrode of the at least one of the first and the second electrodes.

3. The resonator as claimed in claim 2, wherein the metal film is formed on at least one of an undersurface of the first electrode, an upper surface of the first electrode, an undersurface of the second electrode, and an upper surface of the second electrode.

4. The resonator as claimed in claim 2, wherein the metal film is formed in a belt shape, which surrounds the active region portion of at least one of the first and the second electrodes.

5. The resonator as claimed in claim 4, wherein the metal film further comprises one of at least one groove and at least one penetrated hole formed along the middle of the width of the belt shape.

6. The resonator as claimed in claim 2, wherein the metal film is formed of one of the same metal as that of the first and the second electrodes and the same metal as that of an electrode pad, which electrically connects the first and the second electrodes of the resonating unit with an external circuit, when the electrode pad is formed.

7. The resonator as claimed in claim 2, wherein the metal film is formed of a material selected from Au, Ti, Ta, Mo, Ru, Pt, W, Al, and Ni.

8. The resonator as claimed in claim 2, wherein the metal film is formed on an edge part of the active region portion of the at least one of the first and the second electrodes, so that the edge part of the active region portion has a thickness larger than that of a center part of the active region portion.

9. The resonator as claimed in claim 1, wherein the at least one of the first and the second electrodes is formed, so that an entire portion of the non-active region portion of the at least one of the first and the second electrodes has a thickness different from that of the active region portion of the at least one of the first and the second electrodes, respectively.

10. The resonator as claimed in claim 9, wherein at least one of the first and the second electrodes comprises a metal film formed thereon on the entire portion of the non-active region portion of the at least one of the first and the second electrodes, so that the entire portion of the non-active region portion of the at least one of the first and the second electrodes has a thickness larger than that of the active region portion of a respective electrode of the at least one of the first and the second electrodes.

11. The resonator as claimed in claim 2, wherein the metal film is disposed onto the non-active region portion of the second electrode, and the metal film is formed in a form of a closed-looped belt having a predetermined width and surrounds a periphery of the active region portion of the second electrode such that only the active region portion of the second electrode of the entire second electrode is exposed to an opening.

12. The resonator as claimed in claim 2, wherein the metal film is disposed onto the non-active region portion of the first electrode, between the first electrode and the piezoelectric film, and the metal film is formed in a form of a closed-looped belt having a predetermined width and surrounds a periphery of the active region portion of the first electrode such that only the active region portion of the first electrode of the entire first electrode is exposed to the piezoelectric film.

13. The resonator as claimed in claim 1, wherein the portion of the non-active portion of the first electrode has a thickness larger than that of the active region portion of the first electrode.

14. The resonator as claimed in claim 1, wherein the portion of the non-active portion of the second electrode has a thickness larger than that of the active region portion of the second electrode.

15. The resonator as claimed in claim 1, wherein the piezoelectric film has a substantially uniform thickness throughout the resonator.

16. The resonator as claimed in claim 2, wherein the metal film is a separate and distinct layer from the first electrode and the second electrode.

17. The resonator as claimed in claim 2, wherein the metal film is formed such that an entire portion of the metal film is overlapped with at least one of the first and the second electrodes in the vertical direction.

18. The resonator as claimed in claim 11, wherein the metal film is not disposed onto the active region portion of the second electrode.

19. The resonator as claimed in claim 1, wherein the air cavity has a quadrilateral shape, and a lower surface of the air cavity is disposed on the substrate and the piezoelectric film surrounds the upper surface and two side surfaces of the air cavity such that the air cavity is entirely enclosed by the piezoelectric film and the substrate.

20. The resonator as claimed in claim 1, wherein the second electrode is disposed on the piezoelectric film, so that the side surfaces of the air cavity and side surfaces of the piezoelectric film which cover the side surfaces of the air cavity are covered by the second electrode, the side surfaces of the piezoelectric film being surrounded by the second electrode.

21. The resonator as claimed in claim 20, wherein the second electrode comprises a metal film formed thereon on at least the portion of the non-active region portion of the second electrode, the metal film covering at least side surfaces of the second electrode which cover the side surfaces of the piezoelectric film.

22. The resonator as claimed in claim 20, wherein the second electrode is disposed on the piezoelectric film, so that the upper surface of the air cavity and side surfaces of the air cavity are covered by the second electrode, the air cavity being surrounded by the second electrode.

23. The resonator as claimed in claim 1, wherein the first electrode is disposed between the side surfaces of the air cavity and side surfaces of the piezoelectric film which cover the side surfaces of the air cavity, such that the side surfaces of the air cavity are surrounded by the piezoelectric film and the first electrode.

24. The resonator as claimed in claim 23, wherein the first electrode comprises a metal film formed directly thereon on at least the portion of the non-active region portion of the first electrode, the metal film covering at least at least side surfaces of the first electrode which cover the side surfaces of the air cavity.

25. The resonator as claimed in claim 23, wherein the first electrode is disposed between the air cavity and the piezoelectric film, so that the upper surface of the air cavity and side surfaces of the air cavity are covered by the first electrode, the air cavity being surrounded by the first electrode.

* * * * *